(12) United States Patent
Nakahara et al.

(10) Patent No.: US 7,223,993 B2
(45) Date of Patent: May 29, 2007

(54) OPTICAL SEMICONDUCTOR DEVICE

(75) Inventors: Kouji Nakahara, Kunitachi (JP); Makoto Kudo, Hamura (JP); Shigehisa Tanaka, Kokubunji (JP); Masataka Shirai, Higashimurayama (JP)

(73) Assignee: Hitachi, Ltd., Tokyo (JP)

( * ) Notice: Subject to any disclaimer, the term of this patent is extended or adjusted under 35 U.S.C. 154(b) by 41 days.

(21) Appl. No.: 11/210,760

(22) Filed: Aug. 25, 2005

(65) Prior Publication Data

US 2007/0051939 A1 Mar. 8, 2007

(30) Foreign Application Priority Data

Jan. 11, 2005 (JP) .............................. 2005-003365

(51) Int. Cl.
*H01L 29/06* (2006.01)
(52) U.S. Cl. ............... 257/14; 257/9; 257/E29.072; 438/962; 438/E31.033; 438/E33.008
(58) Field of Classification Search .................. 257/9, 257/14, 962; 438/31
See application file for complete search history.

(56) References Cited

U.S. PATENT DOCUMENTS 6,777,718 B2 * 8/2004 Takagi ......................... 257/98

FOREIGN PATENT DOCUMENTS

| JP | 09-237889 | 2/1996 |
|---|---|---|
| JP | 11-186631 | 12/1997 |
| JP | 2001-290114 | 4/2000 |
| JP | 2002-134842 | 10/2000 |
| JP | 2003-017798 | 7/2001 |
| JP | 2003-142783 | 11/2001 |
| JP | 2003-309127 | 4/2002 |
| JP | 2003-329988 | 5/2002 |
| JP | 2004-179274 | 11/2002 |

* cited by examiner

*Primary Examiner*—Quoc Hoang
(74) *Attorney, Agent, or Firm*—Reed Smith LLP; Stanley P. Fisher, Esq.; Juan Carlos A. Marquez, Esq.

(57) ABSTRACT

In the semiconductor laser or electro-absorption optical modulator that includes strained quantum well layers as active layers, making laser characteristics or modulator characteristics adequate has seen the respective limits since band structures, especially, ΔEc and ΔEv, have been unable to be adjusted independently.

This invention is constructed by stacking an n-type InGaAlAs-GRIN-SCH layer 3, an MQW layer 4, a p-type InGaAlAs-GRIN-SCH layer 5, a p-type InAlAs electron-stopping layer 6, and others, in that order, on an n-type InP wafer 1; wherein the MQW layer 4 includes InGaAlAs-strained quantum well layers and InGaAlAsSb-formed barrier layers each having strain of an opposite sign to the strain applied to the quantum well layers.

15 Claims, 10 Drawing Sheets

InGaAlAs-MQW

FIG. 4(b)

InGaAsP-MQW

OPTICAL SEMICONDUCTOR DEVICE

CLAIM OF PRIORITY

The present application claims priority from Japanese application JP 2005-003365, filed on Jan. 11, 2005, the content of which is hereby incorporated by reference into this application.

BACKGROUND OF THE INVENTION

1. Field of the Invention

The present invention relates to optical semiconductor devices, and more particularly, to a communications semiconductor laser, an optical modulator, both for use as an optical-fiber transmission light source, and an electro-absorption light source that is an integrated unit of both.

2. Description of the Related Art

Figure 4A:
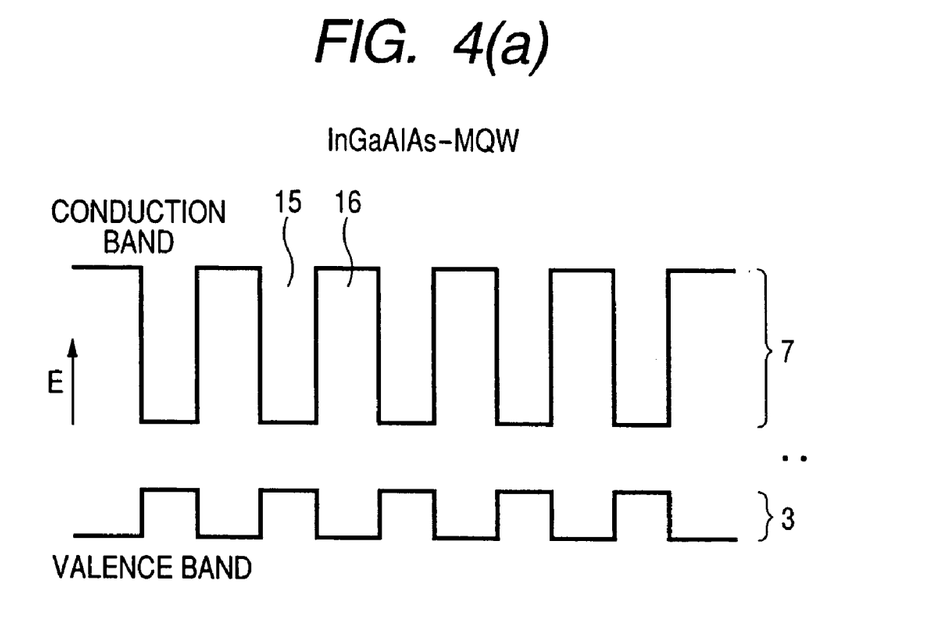
FIG. 4 is an energy band diagram showing a conventional example.
Figure 4B:
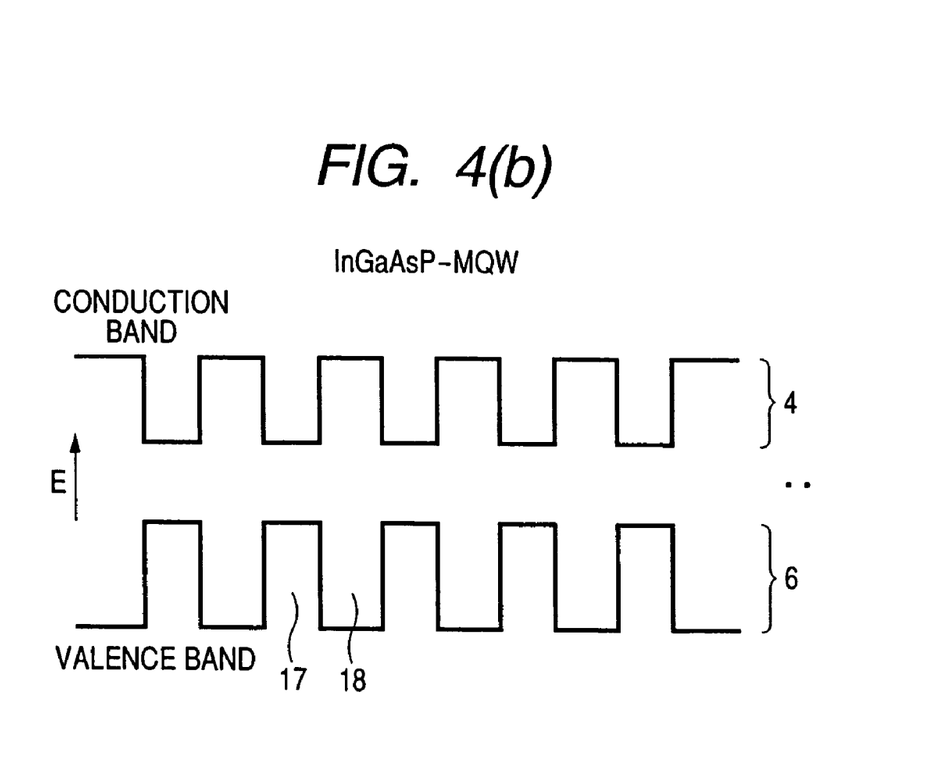

The proliferation of the Internet on a worldwide scale is increasing the data traffic of optical communications networks each year. In response to this increase, the semiconductor-based transmission light sources and optical modulators that are among the key devices in optical-fiber communications networks, or electro-absorption light sources that are each an integrated unit of the former two types of devices are required to ensure even higher performance in terms of, for example, speed and electric power consumption. Along with these demands for higher performance, optical devices with active layers formed of InGaAlAs-based materials have been actively developed in recent years to replace the conventional devices that use InGaAsP-based materials. The multi-quantum-well (MQW) structures that use InGaAlAs-based materials are preferable to the structures that use InGaAsP-based materials. As shown in FIG. 4, the value of $\Delta Ec:\Delta Ev$, the rate of the discontinuity of the conduction band between each quantum well layer and barrier layer in an MQW structure, to the discontinuity of the valence band in the MQW structure, is 4:6 in InGaAsP-MQW, whereas the value of $\Delta Ec:\Delta Ev$ in InGaAlAs-MQW is 7:3. In the InGaAlAs-MQW structure, therefore, electrons smaller than holes in effective mass are liable to be confined within the quantum well layers more easily and holes larger than electrons in effective mass are prone to be distributed more evenly over each quantum well layer within the MQW structure. Reference number 15 in FIG. 4 denotes a quantum well layer of the InGaAlAs-MQW structure, 16 a barrier layer thereof, 17 a quantum well layer of the InGaAsP-MQW structure, and 18 a barrier layer thereof. Since the effective mass of electrons in a semiconductor is less than one-sixth of that of holes, it can be seen that in terms of band structure, the InGaAlAs-MQW structure is preferable to the InGaAsP-MQW structure.

The preferableness of the InGaAlAs-MQW structure in terms of band structure, however, is conditional upon no application of strain to the quantum well layers or the barrier layers. The improvement of a differential gain is required for faster operation, and strain is applied to the quantum well layers as one method of increasing a differential gain. Strain application to the semiconductor deforms the valence band structure and separates the heavy holes and light holes that have been degenerate. Consequently, the influence of valence band mixing diminishes and effective mass decreases. Applying this method to the quantum well layers, therefore, increases an optical gain and a differential gain. Further increasing the number of quantum wells correspondingly improves the differential gain. Dislocation occurs in the semiconductor crystal if the number of quantum wells is increased under the state where strain is applied only to the quantum well layers. For this reason, it is very effective to adopt a strain-compensated structure in which strain is applied to barrier layers in a direction reverse to that of strain application to quantum well layers. Hereinafter, the compressive strain applied to the wafer is expressed with a plus (+) sign, and the tensile strain applied is expressed with a minus (−) sign.

The application of strain, however, shifts the 'end of band' of the semiconductor, resulting in a ratio different from the $\Delta Ec:\Delta Ev$ ratio obtained under no strain. For example, in the quantum well structure having a 1.5%-strained quantum well layer and a −0.55%-strained barrier layer with respect to an InP wafer, $\Delta Ec:\Delta Ev$ is almost 5.9:4.1. Also, in the quantum well structure having a −1.2%-strained quantum well layer and a 0.55%-strained barrier layer, $\Delta Ec:\Delta Ev$ is almost 6.4:3.6. These values indicate that an InGaAlAs-based quantum structure in which strain is applied to quantum well layers in order to enhance performance is not always preferable in terms of band structure. In the conduction band, a carrier overflow of electrons occurs, and in the valence band, holes are liable to exist unevenly within the MQW structure. This is due to the fact that the $\Delta Ec$ and $\Delta Ev$ values that denote band discontinuity are determined by the composition ratio and strain level of $In_xGa_yAl_{(1-x-y)}As$, and more particularly, due to the fact that it is almost impossible to change $\Delta Ec$ and $\Delta Ev$ independently. Therefore, if the bandgap of the barrier layer (shortening the composition wavelength) is increased in an attempt to suppress the carrier overflow of electrons in the conduction band, both $\Delta Ec$ and $\Delta Ev$ will increase and holes will be easier to exist unevenly over each quantum well layer in the valence band. As a result, overall laser characteristics inclusive of a differential gain will not improve.

Figure 5:
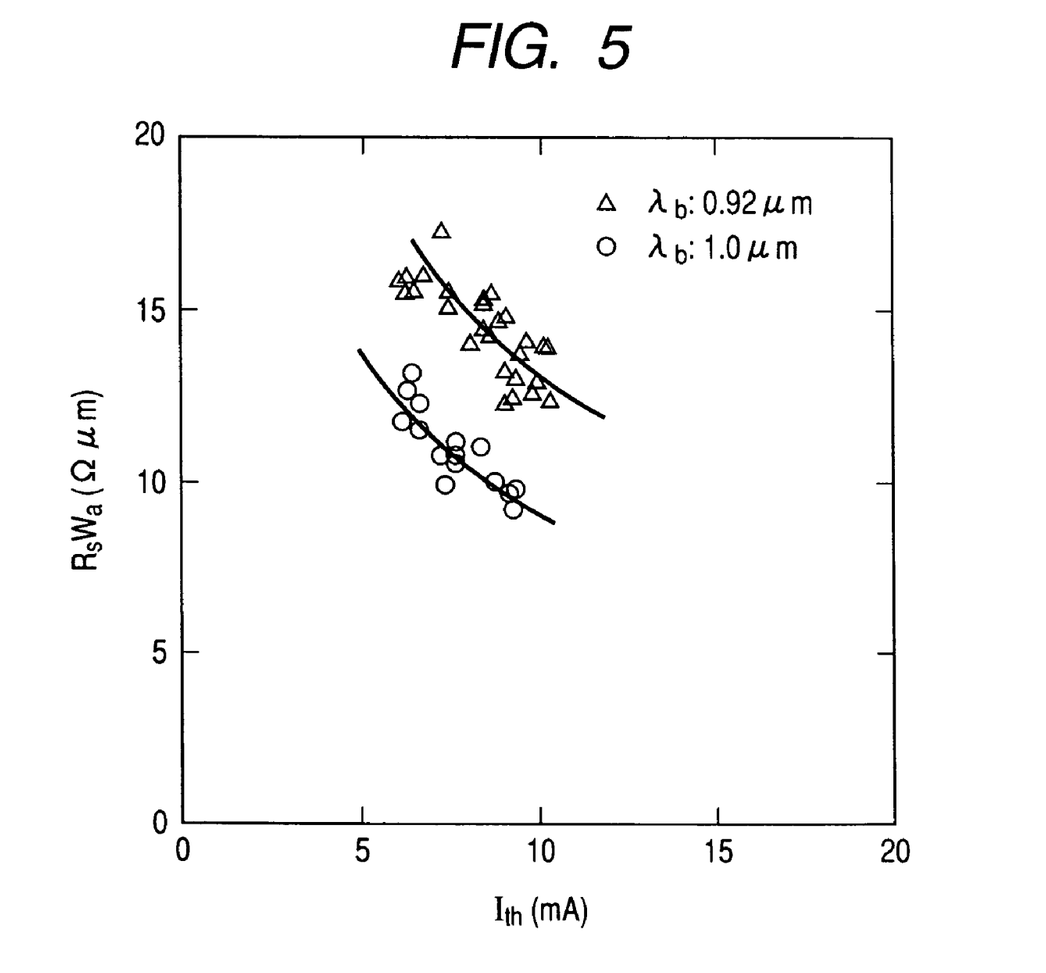
FIG. 5 is a diagram showing experimental results based on the conventional example.

Furthermore, experimental results by the present inventors obviously indicate that increases in $\Delta Ev$ of InGaAlAs-MQW lasers increases device resistance. FIG. 5 shows the relationship between the threshold current (Ith) data that the inventors measured in InGaAlAs-MQW ridge waveguide lasers, and the device resistance value standardized with mesa stripe width (Wa). Changing the threshold current by varying cavity loss in terms of edge reflectivity, for example, changes device resistance, even for the same waveguide structure including the same active layers. The symbol Δ in the figure denotes a laser in which a barrier layer was created with an InGaAlAs composition wavelength of 0.92 μm (bandgap: 1.348 eV), and the symbol ○ denotes a laser in which a barrier layer was created with an InGaAlAs composition wavelength of 1.0 μm (bandgap: 1.239 eV). Both laser structures are the same, except for the composition wavelength of the barrier layer. As can be seen from the figure, the device resistances with the composition wavelength of 1.0 μm are lower than those with the composition wavelength of 0.92 μm. In consideration of the ratio between electrons and holes in terms of effective mass, and the ratio between $\Delta Ec$ and $\Delta Ev$, the reason for the reduction in the resistance is attributable to the magnitude of $\Delta Ev$ in the valence band. In other words, $\Delta Ev$ of the barrier layer with the 0.92-μm composition wavelength, with respect to that of the quantum well layer, is 156 meV, whereas $\Delta Ev$ of the barrier layer with the 1.0-μm composition wavelength is 123 meV. This difference appears as the difference in device resistance.

For these reasons, with the conventional technology, because of ΔEc and ΔEv being independently uncontrollable, it has been very difficult to obtain a device that simultaneously achieves the improvement of a differential gain and the improvement of laser characteristics, such as reduction in device resistance.

Other problems associated with the relationship between ΔEc and ΔEv also occur in electro-absorption optical modulators. If ΔEv is larger, the event of pile-up occurs when a reverse voltage is applied at an eletcro-absorption optical modulator. Holes cannot be removed from the MQW structure in the pile-up phenomenon. This results in optical signals being deteriorated by the particular pattern of the optical signals or in optical-fiber long-distance transmission being impeded by dynamic fluctuations in optical wavelength, called "chirping." Decrease in the bandgap of the barrier layer (extending the composition wavelength) reduces ΔEv and thus suppresses the pile-up event. However, since ΔEc is also reduced at the same time, the resulting quantum effect in the conduction band is diminished and this blurs the absorption edge of the semiconductor bandgap. Accordingly, the problem occurs in that even when the reverse voltage is not applied, i.e., even at a '1' level, light is absorbed and its extinction ratio deteriorates. This problem is also due to the independent uncontrollability of ΔEc and ΔEv.

A semiconductor multilayer structure based on another conventional technology, and an optical control device using the semiconductor multilayer structure are disclosed in Japanese Patent Laid-open No. 2003-329988. According to this disclosure, a 1.8-nm-thick $In_{0.8}Ga_{0.2}As$ film is used to form quantum well layers, and a 5.5-nm-thick $AlAs_{0.55}Sb_{0.45}$ or $AlAs_{0.5}Sb_{0.5}$ film is used to form barrier layers. This device utilizes the large ΔEc value of a conduction band to achieve high-speed optical switching based on the intersubband transition between the first level and second level in the conduction band. However, this technology is not used in regard to whether ΔEv and ΔEc are independently adjustable, and the improvement of a differential gain that is an object of the present invention is not described in the above disclosure. In addition, since the type of input signal is light, no description is given of reduction in device resistance. According to the above disclosure, ΔEv is at least 280 meV. In addition, all layers of the device, such as the cladding layers, except in quantum well layers, are not doped with the dopant because of its operating principles.

SUMMARY OF THE INVENTION

A first object of the present invention is to provide a semiconductor laser that is low in device resistance and allows high-speed modulation in wide temperature ranges including a high-temperature range.

A second object of the present invention is to provide an optical modulation device which, compared with a conventional device, operates at low voltage, causes insignificant chirping, and has a high extinction ratio. A third object of the present invention is to provide a semiconductor laser light source obtained by integrating: a semiconductor laser low in device resistance and allowing high-speed modulation in wide temperature ranges inclusive of a high-temperature range; and an optical modulation device which, compared with a conventional device, operates at low voltage, causes insignificant chirping, and has a high extinction ratio.

A fourth object of the present invention is to provide an optical semiconductor device having long-term reliability, i.e., excellent in deterioration characteristics associated with electrical energization.

The above first, second, and third objects of the present invention can be attained by providing an optical semiconductor device adapted to include a multiple-quantum-well structure formed on an upper section of an InP semiconductor wafer, and means for applying a voltage, or supplying an electric current, to the multiple-quantum-well structure, wherein: quantum well layers in the multiple-quantum-well structure are each constructed as an InGaAlAs layer having a strain of a different lattice constant with respect to the wafer, and barrier layers in the multiple-quantum-well structure are each constructed as an InGaAlAsSb layer having a strain of a different lattice constant with respect to the wafer, the strain being assigned a sign opposite to that of the strain of each quantum well layer.

In the present invention, the strain-compensated type of MQW structure constructed of the InGaAlAs-strained quantum well layers and the InGaAlAsSb-strained barrier layers allows ΔEc and ΔEv to be arbitrarily set. This structure is therefore effective in achieving device resistance reduction and differential gain improvement at the same time for the semiconductor laser. Since Sb (antimony) is introduced into the barrier layers, this structure is also effective in improving reliability. Additionally, application to an electro-absorption optical modulator makes this structure effective in reducing a driving voltage, reducing the occurrence of chirping, increasing an extinction ratio, and reducing a pattern effect.

DETAILED DESCRIPTION OF THE PREFERRED EMBODIMENTS

Embodiments of the present invention will be described in detail below.

First Embodiment

Figure 1:
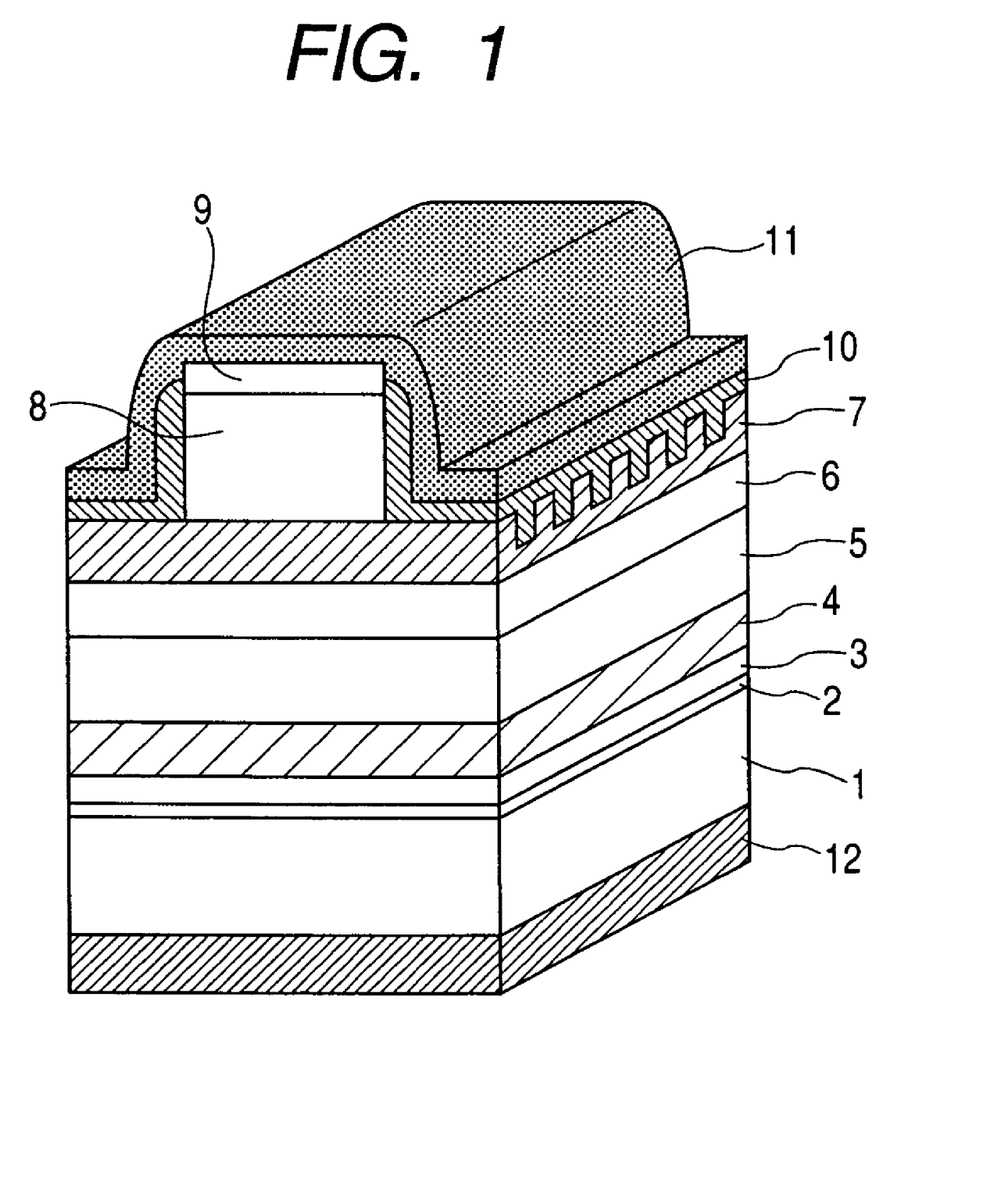
FIG. 1 is a structural view of an optical semiconductor device, showing an embodiment of the present invention.

A first embodiment is an example in which the present invention is applied to a 1.3-μm-band DFB (distributed feedback) laser for optical-fiber communication. This laser can be of a known structure, except for active layers. A perspective view of the laser structure employed in the present embodiment is shown in FIG. 1. Reference number 1 in FIG. 1 denotes an n-type InP wafer, which also functions as a lower cladding layer. Reference number 2 denotes a 30-nm-thick n-type InAlAs layer, and 3 denotes a GRIN-SCH (Graded-Index—Separate Confinement Structure) layer of 0.08-μm-thick n-type InGaAlAs with a carrier concentration of $1 \times 10^{18}$ cm$^{-3}$. Reference number 4 denotes an MQW layer that includes a quantum well layer formed of $In_{0.733}Ga_{0.132}Al_{0.135}As$, and a barrier layer formed of $In_{0.36}Ga_{0.32}Al_{0.32}As_{0.92}Sb_{0.08}$. The quantum well layer has a thickness of 5 nm and a compressive strain of 1.4% with respect to the InP wafer, and the barrier layer has a thickness of 8 nm and a tensile strain of −0.55% with respect to the InP wafer. The number of quantum well layers is 10, and the total number of barrier layers arranged at top and bottom of each quantum well layer is 11. Reference number 5 denotes a GRIN-SCH layer of 0.04-μm-thick p-type InGaAlAs with a carrier concentration of $6 \times 10^{17}$ cm$^{-3}$, 6 denotes an electron-stopping layer of 0.04-μm-thick p-type InGaAlAs with a carrier concentration of $9 \times 10^{17}$ cm$^{-3}$, and 7 denotes a grating layer of 0.07-μm-thick p-type InGaAsP with a carrier concentration of $1.4 \times 10^{18}$ cm$^{-3}$. The grating layer 7 has a composition wavelength of 1.15 μm. Reference number 8 denotes a first upper cladding layer of 1.5-μm-thick p-type InP with a carrier concentration of $1.2 \times 10^{18}$ cm$^3$, and the layer 8 has a ridge waveguide mesa stripe width of 1.8 μm. Reference number 9 denotes a contact layer for obtaining ohmic contact with an electrode, and p-type InGaAs that is lattice-matched to the InP wafer is used to form the contact layer.

Figure 2:
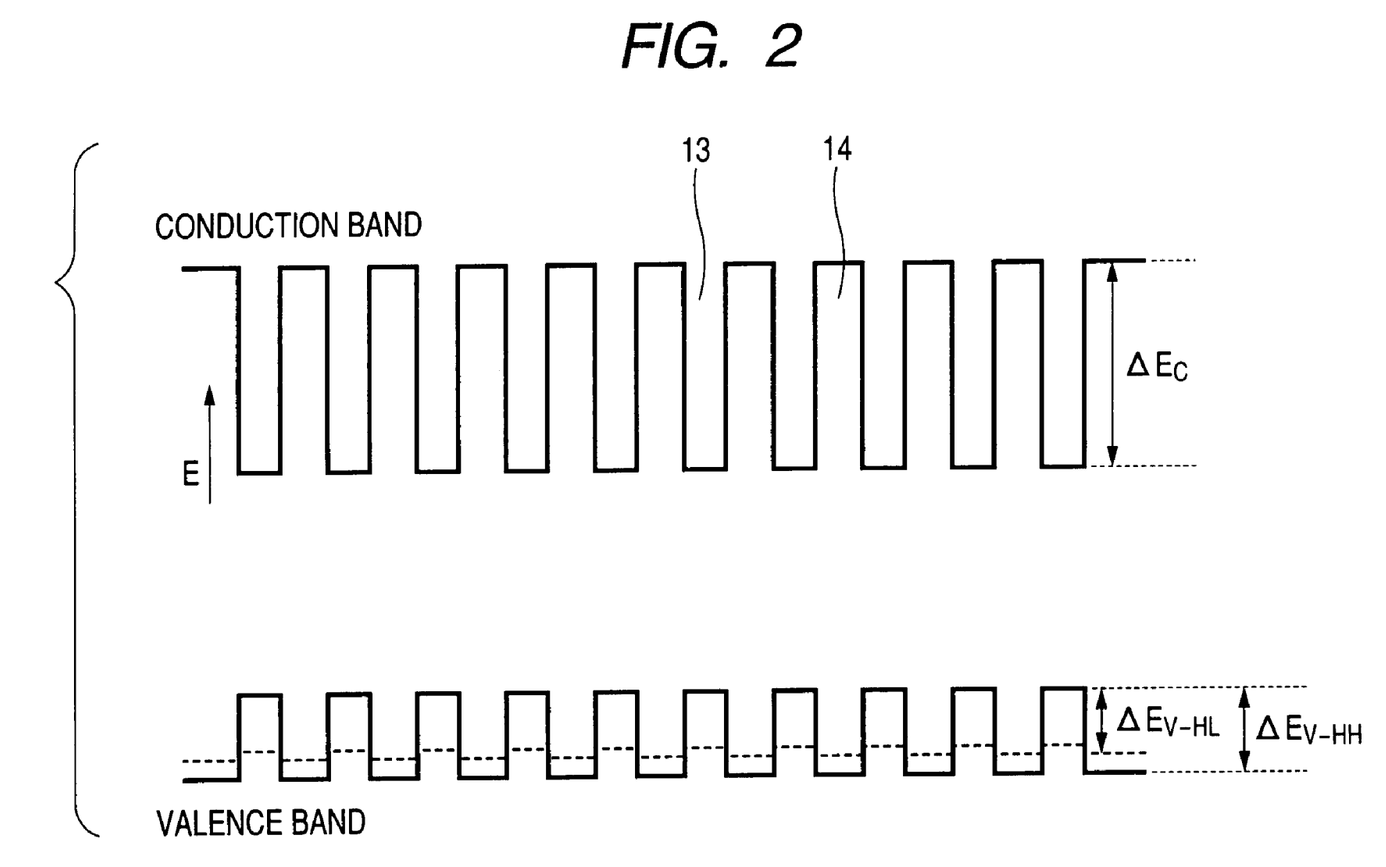
FIG. 2 is an energy band diagram of the multiple-quantum-well layer formed in another embodiment of the present invention.
Figure 3:
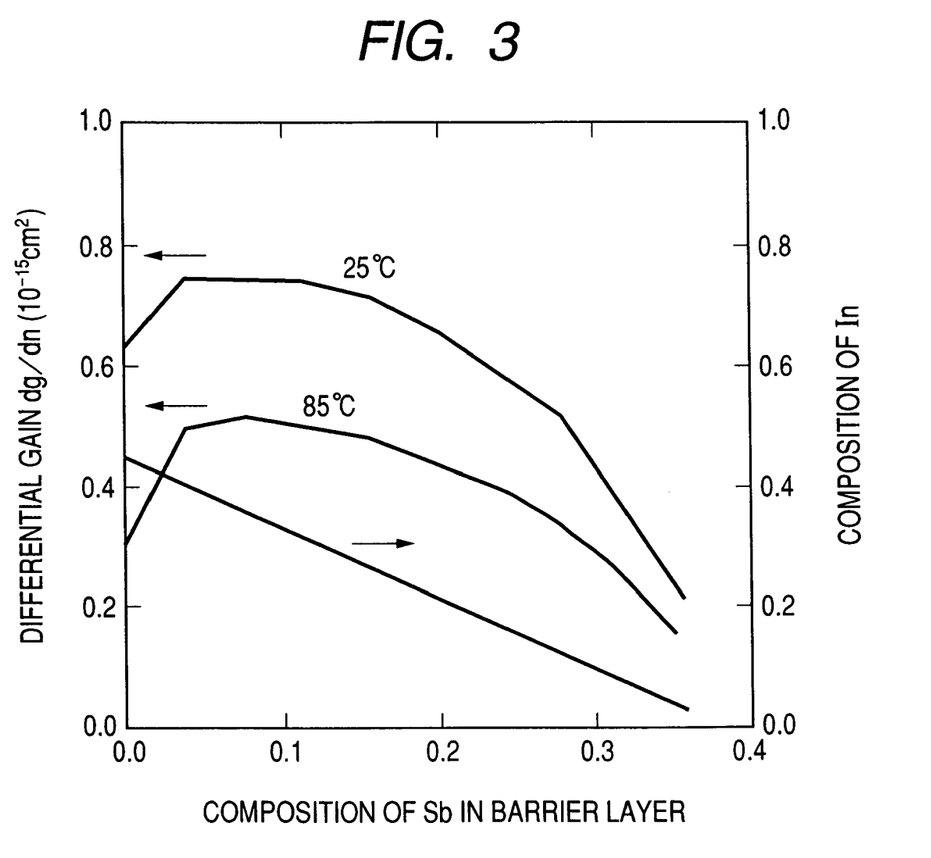
FIG. 3 is a relational diagram between a differential gain and an In-content or barrier layer Sb-content, showing an advantageous effect of the present invention.

An energy band diagram of an MQW structure is shown in FIG. 2. Reference number 13 denotes a quantum well layer formed of $In_{0.733}Ga_{0.132}Al_{0.135}As$ with a strain of 1.4%, and 14 denotes a barrier layer formed of $In_{0.36}Ga_{0.32}Al_{0.32}As_{0.92}Sb_{0.08}$ with a strain of −0.55% and a composition wavelength of 0.87 μm. Band discontinuity ΔEc of a conduction band in this structure is as great as 413 meV. In a valence band, the heavy holes and light holes that have been degenerate are greatly separated by strain, and in the quantum well layer placed under compressive strain as in FIG. 2, the heavy holes denoted by a solid line shift upward and the light holes denoted by a dotted line shift downward. Conversely, in the barrier layer placed under tensile strain, the light holes denoted by a dotted line shift upward and the heavy holes denoted by a solid line shift downward. Accordingly, an effective depth of each quantum well in the valence band, i.e., the value expressed as ΔEv in the description of a conventional example, is expressed, in the present embodiment, as $\Delta E_{v\text{-}HL}$ to denote an energy level difference between the heavy holes in the quantum well layer and the light holes in the barrier layer. A value of $\Delta E_{v\text{-}HL}$ in the present embodiment is 123 meV. Although description has been omitted in the conventional example, it is preferable that band discontinuity ΔEv ($\Delta E_{v\text{-}HL}$) in the valence band should be greater in terms of improvement of a differential gain, and ΔEv ($\Delta E_{v\text{-}HL}$) is in a trade-off relationship with respect to presence of uniform holes and to device resistance. In the present embodiment, ΔEv is set to the same value as that of the InGaAlAs barrier layer of a 1.0-μm composition wavelength in the conventional structure. FIG. 3 shows the calculation results on a differential gain, obtained when a content of Sb was increased while a composition of $In_xGa_yAl_{1-x-y}As_{1-z}Sb_z$ was being adjusted for constant ΔEv. During the calculation of the differential gain, a band structure based on a Kane's model and derived from a 4×4 Luttinger-Kohn Hamiltonian was used and studies at 25° C. and 85° C. were conducted to allow for a carrier overflow. The structure with a 0 content of Sb, shown at the leftmost end of FIG. 3, is the conventional structure. As can be seen from this figure, at ambient temperatures of 25° C. and 85° C., the differential gain increases with increases in Sb-content and becomes a maximum in vicinity of about 0.1 in terms of Sb-content. These indicate that the differential gain increases by 20% to 70% of that obtainable in the conventional structure. This increase in the differential gain is primarily due to carrier overflow reduction. Further increasing the Sb-content reduces the differential gain. This reduction is considered to result from an increase in effective mass of holes in the barrier layer due to a decrease in the In-content shown together with the Sb-content in FIG. 3. A desirable Sb-content "z" range in the present embodiment is therefore considered to be 0<z≦0.3 at 85° C. Also, it follows from FIG. 3 that a desirable In-content is 0.1 or more.

In the present embodiment, the composition of InGaAlAsSb was adjusted in order for ΔEv to become 123 meV. Adjusting the composition between Sb, In, and Al, however, makes ΔEc and ΔEv independently adjustable and allows ΔEc and ΔEv to be optimized together with parameters such as the number of quantum well layers.

In the present embodiment, a DFB laser provided with processing to obtain a front film reflectivity and a back mirror reflectivity of 0.4% and 90%, respectively, for a resonator length of 200 μm was created and a device resistance of 5.6Ω, 30% lower than in the conventional laser using a 0.92-μm-composition InGaAlAs barrier layer, was obtained to reflect low ΔEv. Also, a differential gain of $5.2 \times 10^{-16}$ cm$^2$, 70% higher than in the conventional laser using a 0.92-μm-composition InGaAlAs barrier layer, was obtainable at 85° C. Comparisons with respect to the conventional example are listed in Table 1.

TABLE 1

|  | InGaAlAs barrier layer | | InGaAlAsSb barrier layer |
|---|---|---|---|
| Structural wavelength or Sb-content | 0.92 μm | 1.0 μm | 0.87 μm |
| ΔEc (meV) | 269 | 191 | 413 |
| ΔEv ($\Delta E_{v\text{-}HL}$) | 154 | 123 | 123 |
| Device resistance | 7.8 | 5.6 | 5.6 |
| Differential gain at 85° C. ($10^{-16}$ cm$^2$) | 5.2 | 3.0 | 5.2 |

As can be seen from Table 1, the device of the present invention can have characteristics that include both device resistance as low as that of a 1.0-μm-composition InGaAlAs barrier layer, and a differential gain equivalent to that of a 0.92-μm-composition InGaAlAs barrier layer. This means that the conventional trade-offs can be overcome. The device of the present invention can obtain low threshold currents of 7.8 mA and 17.5 mA at 25° C. and 85° C., respectively. High slope efficiency of 0.28 W/A or 0.21 W/A is obtained at 25° C. or 85° C., respectively. Also, a preferable single-mode yield of 60% is obtained because of use of a λ/4-structured diffraction grating with EB (electron beam)-lithographically created shifting positions provided backward at 8:2. An appropriate eye opening reflecting the above characteristics is obtainable during 25-Gbps transmission with an extinction ratio of 7 dB at 85° C.

Figure 6:
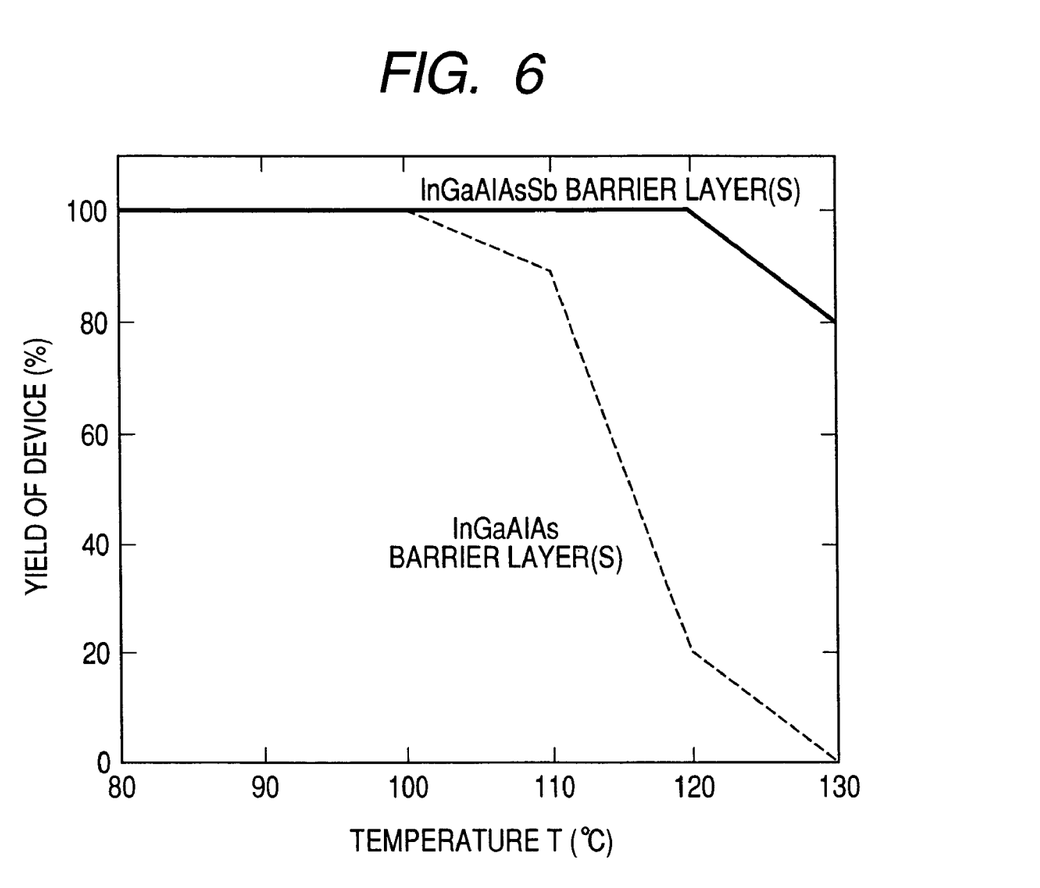
FIG. 6 is a relational diagram between a defective device ratio and a testing temperature, showing another advantageous effect of the present invention.

Additionally, in terms of reliability, better results than in the laser of the conventional structure were obtained in the present embodiment. Burn-in test results on the semiconductor laser of the present embodiment and on the semiconductor laser of the conventional structure with an InGaAlAs barrier layer are shown in FIG. 6. These tests were conducted to identify laser deterioration levels by supplying a fixed current of 120 mA for 40 hours at a certain temperature and then examining changes in threshold current from the state existing before the test. Threshold current changes up to 7% were set as acceptable levels during the tests. The test temperature was varied from 80° C. to 130° C. At up to 100° C., an acceptability ratio of 100% is obtained for both devices, as shown in FIG. 6. At temperatures exceeding 100° C., however, the acceptability ratio of the InGaAlAs laser is higher in decrease rate, whereas the device with the InGaAlAsSb barrier layer in the present embodiment exhibits a 100% acceptability ratio at up to 120° C. This is estimated to be due to the fact that since group-V atoms within the crystal contained in the barrier layer are atoms of As and Sb, dislocation is not easily accelerated even if crystal defects occur. Another probable reason is that since Sb is prone to grow two-dimensionally during crystal growth, the MQW layers would remain flat, even on the order of atomic layers.

Figure 9:
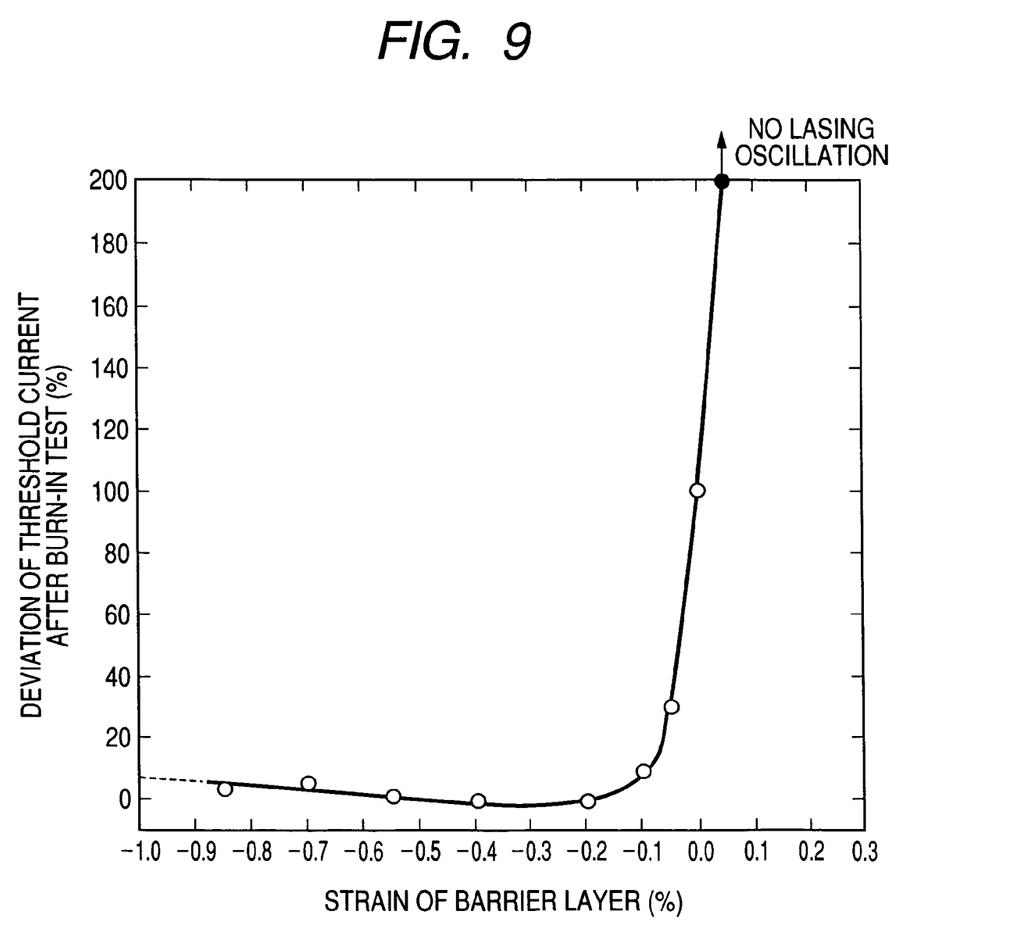
FIG. 9 is a relational diagram between changes in threshold current after burn-in testing, and the strain of a barrier layer, showing yet another advantageous effect of the present invention.

It can also be seen that in the present embodiment, strain compensation is absolutely necessary in terms of reliability. FIG. 9 shows the changes in threshold current, observed before and after burn-in testing with devices whose barrier layers were varied only in strain level in the present embodiment. A current of 100 mA was supplied for 40 hours at 110° C. during the burn-in tests. The plots (white circles) shown in the figure denote median values of threshold current change rates of 10 devices. As can be seen from the figure, threshold currents change very significantly in a plus (+) direction from −0.1% within a strain range of the barrier layers. In addition, no lasing oscillation occurs at a barrier layer strain level of +0.05%. This tendency also applies to devices with a quantum well layer strain level of +0.7%, and threshold currents change very significantly in the plus (+) direction from −0.1%. This is considered to be due to the fact that because of no strain compensation, the MQW structure would have its crystallinity deteriorated by external stresses during the burn-in tests. When compressive strain is applied to the quantum well layers, therefore, tensile strain of at least 0.1% (in terms of absolute strain value, 0.1% or more) needs to be applied to the barrier layers.

Although the barrier layer in the MQW layer structure of the present embodiment has been undoped, the differential gain can be further improved by modifying only the barrier layer into a p-type modulation doped MQW structure. In addition, a desirable value for increasing the differential gain for the quantum well layers placed under compressive strain in the present embodiment is at least 4 nm, but up to 7 nm, in which range a sufficient quantum size effect appears. For the barrier layers, it is desirable that the wave functions formed by adjacent quantum well layers should not overlap on one another. Usually, the thickness needed to realize this is at least 6 nm for semiconductor lasers. Desirable barrier layer thickness, however, is at least 4 nm because each barrier layer is of the InGaAlAsSb construction consisting of five atomic elements and because actually effective mass of electron is larger than that of InGaAlAs.

Second Embodiment

Figure 7:
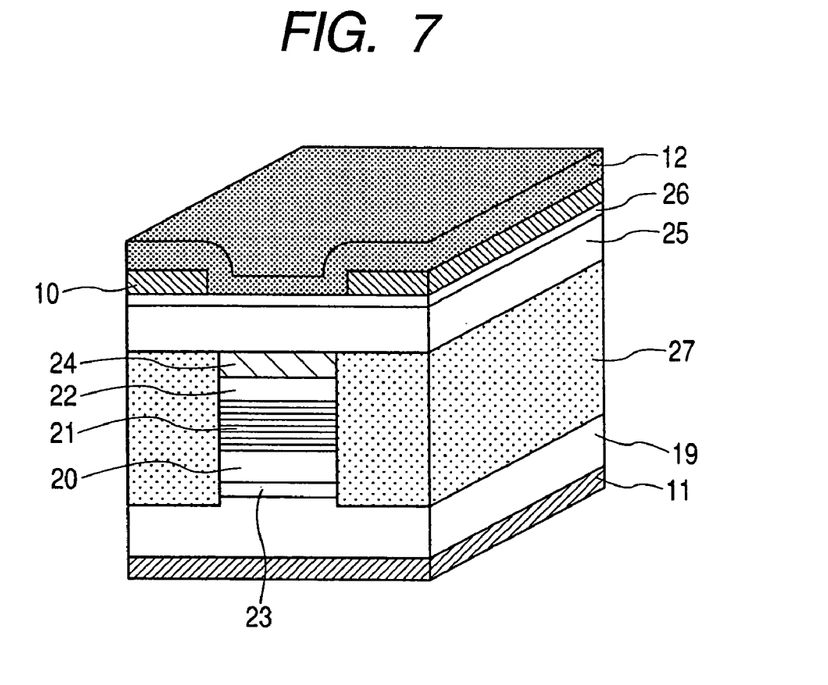
FIG. 7 is a structural view of an optical semiconductor device, showing another embodiment of the present invention.

A second embodiment is an example in which the present invention is applied to a 1.3-μm-band DFB (distributed feedback) laser for optical-fiber communication. This laser can be of a known structure, except for active layers, and a laser of a buried heterostructure, fabricated on such a p-type InP wafer as shown in FIG. 7, is applied in the present embodiment. Reference number 19 in FIG. 7 denotes a p-type InP wafer, which also functions as a lower cladding layer. Reference number 23 denotes an electron-stopping layer of 0.03-μm-thick p-type InAlAs with a carrier concentration of $9 \times 10^{17}$ cm$^3$, and 20 denotes an SCH layer of 0.06-μm-thick p-type InGaAlAs with a carrier concentration of $8 \times 10^{17}$ cm$^{-3}$ and a composition wavelength of 0.92 μm. Reference number 21 denotes an MQW layer that includes a quantum well layer formed of $In_{0.329}Ga_{0.649}Al_{0.022}As$, and a barrier layer formed of $In_{0.555}Ga_{0.152}Al_{0.293}As_{0.96}Sb_{0.04}$ (composition wavelength: 1.06 μm) The quantum well layer is 7 nm thick and has a tensile strain of −1.4% with respect to the InP wafer, and the barrier layer is 8 nm thick and has a compressive strain of 0.5% with respect to the InP wafer. Band discontinuity ΔEc of a conduction band in this structure is as great as 312 meV. The number of quantum well layers is 8, and the total number of barrier layers arranged at top and bottom of each quantum well layer is 9. Reference number 22 denotes an SCH layer of 0.06-μm-thick n-type InGaAlAs with a carrier concentration of and a composition wavelength of 0.92 μm, and 24 denotes a grating layer of 0.07-μm-thick n-type InGaAsP with a carrier concentration of $1.0 \times 10^{18}$ cm$^{-3}$ and a composition wavelength of 1.15 μm, this grating layer having concave and convex shape with 0.03-μm depth at upper sections. Reference number 25 denotes an n-type InP cladding layer with a carrier concentration of $1.0 \times 10^{18}$ cm$^3$, and 26 denotes a contact layer for obtaining ohmic contact with an electrode, and InGaAsP that is lattice-matched to the InP wafer is used to form the contact layer. Reference number 27 denotes a semiconductor current-blocking layer for ensuring that current flows only in/through active layers. Reference number 10 denotes a $SiO_2$ passivation film, 11 a p-side electrode, and 12 an n-side electrode.

In the present embodiment, since tensile strain is assigned to each quantum well layer included in the MQW layer structure, light holes shift upward, and heavy holes shift downward, in the quantum well layer. The light holes in the valence band and the electrons existing in the conduction band generate laser oscillation in TM mode. In each barrier layer placed under compressive strain, conversely, light holes shift upward and heavy holes shift downward. In the present embodiment, equivalent to ΔEv is $\Delta E_{v\text{-}HL}$, which denotes an energy level difference between the light holes in the quantum well layer and the heavy holes in the barrier layer. A value of $\Delta E_{v\text{-}HL}$ in the present embodiment is 125 meV.

In the present embodiment, ΔEv is set to the same value as that of the InGaAlAs barrier layer of a 1.08-μm composition wavelength in the conventional structure. Similarly to the first embodiment, calculations were performed on a differential gain obtained when a content of Sb was increased while a composition of $In_xGa_yAl_{1-x-y}As_{1-z}Sb_z$ was being adjusted for constant $\Delta Ev$. Qualitatively, almost the same tendency as that of the first embodiment was obtainable as a result. That is to say, at both ambient temperatures of 25° C. and 85° C., the differential gain increases with increases in Sb-content and becomes a maximum in vicinity of about 0.06 in terms of Sb-content. These indicate that the differential gain, compared with that of the conventional structure, increases by about 12% at 25° C. and about 13% at 85° C. A differential gain improvement effect according to the present (second) embodiment is small, compared with that of the first embodiment. However, the quantum well layers exposed to tensile strain are originally high in differential gain, and compared with the values achievable by applying compressive strain, high differential gains of $9.1 \times 10^{-16}$ cm$^2$ at 25° C. and $7.5 \times 10^{-16}$ cm$^2$ at 85° C. are obtained in the present embodiment. Further increasing the Sb-content reduces the differential gain, as in the first embodiment. These tendencies occur for the same reasons as those described in the first embodiment. A desirable Sb-content "z" range is $0 < z \leq 0.15$ at 85° C. Also, a desirable In-content is 0.5 or more.

In addition, in the present embodiment, study results based on the same burn-in tests as in the first embodiment indicate almost the same tendencies as those shown in FIG. 9. More specifically, in the present embodiment, since tensile strain is applied to each quantum well layer, when a compressive strain of at least 0.1% is introduced into each barrier layer, increase rates of a threshold current before and after burn-in testing are suppressed to 10% or less in terms of median value. There is a 42% threshold current increase when the strain of the barrier layer is 0%. It is desirable, therefore, that a compressive strain of at least 0.1% be applied to the barrier layer.

In the present embodiment, the composition of InGaAlAsSb was adjusted in order for $\Delta Ev$ to become 126 meV. Adjusting the composition between Sb, In, and Al, however, makes $\Delta Ec$ and $\Delta Ev$ independently adjustable and allows $\Delta Ec$ and $\Delta Ev$ to be optimized together with parameters such as the number of quantum well layers.

In the present embodiment, a DFB laser provided with processing to obtain a front film reflectivity and a back mirror reflectivity of 0.4% and 90%, respectively, for a resonator length of 200 μm was created and a device resistance of 4.8Ω, about 23% lower than in the conventional laser using a conventional InGaAlAs barrier layer, was obtained to reflect low $\Delta Ev$. Also, a differential gain of $7.3 \times 10^{-16}$ cm$^2$, 10% higher than in the laser using an InGaAlAs barrier layer of a conventional composition, was obtainable at 85° C. The semiconductor laser of low device resistance and with a high differential gain was achievable. An appropriate eye opening reflecting the above preferable characteristics is obtainable during 40-Gbps transmission with an extinction ratio of 6 dB at 80° C.

Although, in the present embodiment, InGaAlAs has been used in the SCH layer, an ideal band structure, inclusive of the SCH layer, can be obtained by using InGaAlAsSb or InAlAsSb. In addition, desirable quantum-well layer thickness for increasing a differential gain for such quantum well layers of compressive strain as employed in the present embodiment is from 4 to 9 nm. Furthermore, similarly to the first embodiment, it is desirable that for the barrier layers, the wave functions formed by adjacent quantum well layers should not overlap on one another, and the thickness for achieving this is at least 4 nm.

Third Embodiment

A third embodiment is an example in which the present invention is applied to a 1.55-μm-band DFB ridge waveguide laser for communication, fabricated on an InP wafer. Structurally, the present embodiment is essentially equivalent to the first embodiment, except for an MQW layer. The MQW layer includes a quantum well layer formed of $In_{0.734}Ga_{0.210}Al_{0.056}As$, and a barrier layer formed of $In_{0.368}Ga_{0.399}Al_{0.233}As_{0.92}Sb_{0.08}$ (composition wavelength: 984 μm). The quantum well layer is 5 nm thick and has a compressive strain of 1.4% with respect to the InP wafer, and the barrier layer is 8 nm thick and has a tensile strain of −0.5% with respect to the InP wafer. The number of quantum well layers is 12, and the total number of barrier layers arranged at top and bottom of each quantum well layer is 13. Band discontinuity $\Delta Ec$ of a conduction band in this structure is as great as 409 meV. In a valence band, similarly to the first embodiment, the heavy holes and light holes that have been degenerate are greatly separated by strain. Heavy holes in each quantum well layer shift upward, and conversely, light holes in each barrier layer placed under tensile strain shift downward. An effective depth $\Delta E_{v-HL}$ of each quantum well in the valence band is 123 meV. For the 1.55-μm-band MQW layer in the present embodiment, it is also preferable that band discontinuity $\Delta E_{v-HL}$ in the valence band should be greater in terms of improvement of a differential gain, and $\Delta E_{v-HL}$ is in a trade-off relationship with respect to presence of uniform holes and to device resistance.

In the present embodiment, $\Delta Ev$ is set to the same value as that of the InGaAlAs barrier layer of a 1.15-μm composition wavelength in the conventional structure. Similarly to the first embodiment, calculations were performed on a differential gain obtained when a content of Sb was increased while a composition of $In_xGa_yAl_{1-x-y}As_{1-z}Sb_z$ was being adjusted for constant $\Delta Ev$. Qualitatively, almost the same tendency as that of the first embodiment was obtainable as a result. That is to say, at both ambient temperatures of 25° C. and 85° C., the differential gain increases with increases in Sb-content and becomes a maximum in vicinity of about 0.1 in terms of Sb-content. These indicate that the differential gain, compared with that of the conventional structure, increases by about 27% at 25° C. and up to about 116% at 85° C. Further increasing the Sb-content reduces the differential gain. These tendencies occur for the same reasons as those described in the first embodiment. A desirable Sb-content "z" range is $0 < z \leq 0.3$ at 85° C. Also, a desirable In-content is 0.14 or more. In addition, similarly to the present embodiment, in terms of reliability, when compressive strain is applied to each quantum wall layer as in the present embodiment, it is desirable that a tensile strain of at least −0.1% (in terms of absolute strain value, 0.1% or more) should be applied to each barrier layer.

In the present embodiment, the composition of InGaAlAsSb was adjusted in order for $\Delta Ev$ to become 123 meV. Adjusting the composition between Sb, In, and Al, however, makes $\Delta Ec$ and $\Delta Ev$ independently adjustable and allows $\Delta Ec$ and $\Delta Ev$ to be optimized together with parameters such as the number of quantum well layers.

In the present embodiment, a DFB laser provided with processing to obtain a front film reflectivity and a back mirror reflectivity of 0.4% and 75%, respectively, for a resonator length of 200 μm, was created and a device resistance of 5.0Ω, about 25% lower than in the conventional laser using an InGaAlAs barrier layer of a 1.0-μm composition, was obtained to reflect low $\Delta Ev$. Also, a differential gain of $5.4 \times 10^{-16}$ cm$^2$, 116% higher than in the conventional laser using an InGaAlAs barrier layer of a 1.15-μm composition, was obtainable at 85° C. As can be seen from the above, the device of the present invention can have characteristics that include both device resistance equivalent to that of the 1.15-μm-composition InGaAlAs barrier layer, and a differential gain equivalent to that of the 1.0-μm-composition InGaAlAs barrier layer. The conventional trade-offs can therefore be overcome. The device of the present invention can obtain low threshold currents of 10.2 mA and 21.5 mA at 25° C. and 85° C., respectively. High slope efficiency of 0.24 W/A or 0.19 W/A is obtained at 25° C. or 85° C., respectively. Also, a preferable single-mode yield of 62% is obtained because of use of a λ/4-structured diffraction grating with EB-lithographically created shifting positions provided backward at 7:3. An appropriate eye opening reflecting the above characteristics is obtainable during 20-Gbps transmission with an extinction ratio of 7 dB at 85° C.

Fourth Embodiment

A first embodiment is an example in which the present invention is applied to a 1.55-μm-band electro-absorption optical modulator for communication, fabricated on an InP wafer.

Figure 8:
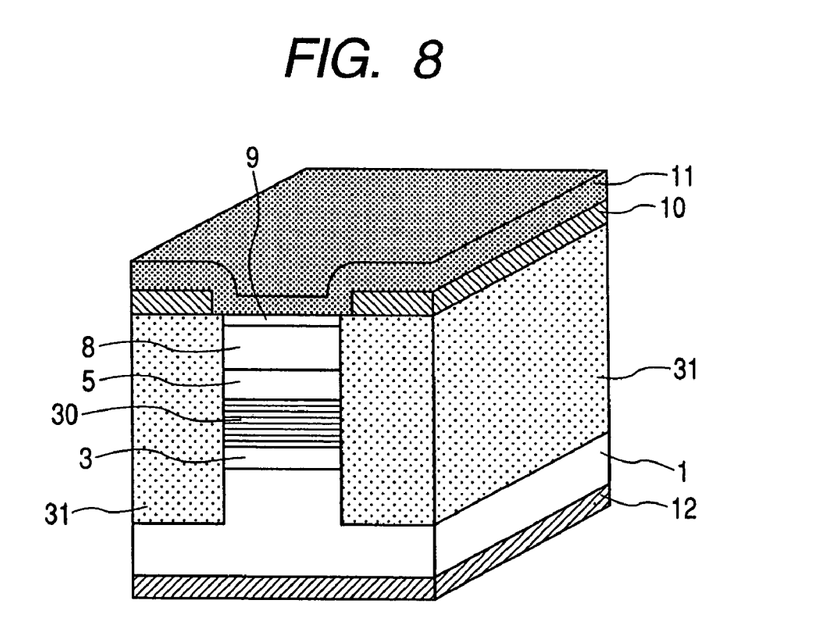
FIG. 8 is a structural view of an optical semiconductor device, showing yet another embodiment of the present invention.

This modulator can be of a known structure, except for MQW absorption layers. A perspective view of the modulator structure employed in the present embodiment is shown in FIG. 8. Reference number 1 in FIG. 8 denotes an n-type InP wafer, which also functions as a lower cladding layer. Reference number 3 denotes a GRIN-SCH layer of 0.08-μm-thick n-type InGaAlAs with a carrier concentration of $1 \times 10^{18}$ cm$^{-3}$, and 30 denotes an MQW layer that includes a quantum well layer formed of $In_{0.654}Ga_{0.290}Al_{0.056}As$, and a barrier layer formed of $In_{0.386}Ga_{0.526}Al_{0.88}As_{0.94}Sb_{0.06}$. The quantum well layer is 9 nm thick and has a compressive strain of 0.85% with respect to the InP wafer, and the barrier layer is 6 nm thick and has a tensile strain of −0.55% with respect to the InP wafer. The number of quantum well layers is 10, and the total number of barrier layers arranged at top and bottom of each quantum well layer is 11. Reference number 5 denotes a GRIN-SCH layer of 0.04-μm-thick p-type InGaAlAs with a carrier concentration of $6 \times 10^{17}$ cm$^{-3}$, 6 denotes an electron-stopping layer of 0.04-μm-thick p-type InAlAs with a carrier concentration of $9 \times 10^{17}$ cm$^{-3}$, and 7 denotes a grating layer of 0.07-μm-thick p-type InGaAsP with a carrier concentration of $1.4 \times 10^{18}$ cm$^{-3}$. The grating layer 7 has a composition wavelength of 1.15 μm. Reference number 8 denotes a first upper cladding layer of 1.5-μm-thick p-type InP with a carrier concentration of $1.2 \times 10^{18}$ cm$^{-1}$, the layer 8 forming a 1.8-μm-wide ridge waveguide mesa stripe. Reference number 9 denotes a contact layer for obtaining ohmic contact with an electrode, and p-type InGaAs that is lattice-matched to the InP wafer is used to form the contact layer.

A value of ΔEc in the present embodiment is 190 meV, which is very large in comparison with those of about 100 meV of the conventional InGaAsP-based and InGaAlAs-based layers. However, ΔEv (ΔE$_{v-HL}$) is 25 meV, which is very small in comparison with those of about 70 meV of the layers in the conventional structures. It is therefore possible to realize a preferable electro-absorption optical modulator which, compared with the conventional devices, has a very small absorbance of light at a '1' level and is free from a pattern effect of input signals due to pile-up, and from deterioration due to chirping.

The electro-absorption optical modulator of the present invention has an extremely short fall time of 15 ps, and 38-GHz high-frequency response characteristics and low-chirping characteristics of this modulator allows transmission to a normal dispersion fiber at a maximum distance of 60 km and at a transmission rate of 20 Gbps.

As far as burn-in testing or long-term reliability is concerned, there is not as much information on electro-absorption modulators as on lasers. However, since, in the first embodiment, the occurrence of device deterioration due to crystallinity depends on whether strain compensation is provided, long-term reliability of modulators can also be guaranteed by introducing the same strain compensation as that of a laser. It is desirable, therefore, that a tensile strain of at least −0.1% (in terms of absolute strain value, 0.1% or more) should be applied to the barrier layers.

In the present embodiment, the composition of InGaAlAsSb was adjusted in order for ΔEv to become 25 meV. Adjusting the composition between Sb, In, and Al, however, makes ΔEc and ΔEv independently adjustable and allows ΔEc and ΔEv to be optimized together with parameters such as the number of quantum well layers.

Additionally, while the present embodiment has applied compressive strain to form the quantum well layers, tensile strain may be applied instead. If tensile strain is applied, since the quantum well layers must be constructed of InGaAs to form the 1.55-μm-band electro-absorption optical modulator, much the same configuration as that of the present embodiment can be taken by combining the quantum well layers with InGaAlAsSb barrier layers of a compressive strain. At this time, polarization dependence of light is diminished by certain tensile strain at the quantum well layers, so a preferable electro-absorption optical modulator can be created. In this case, it is also desirable in terms of reliability that a compressive strain of at least 0.1% be applied to the barrier layers.

Although, in the present embodiment, InGaAlAs has been used in the SCH layer, an ideal band structure, inclusive of the SCH layer, can be obtained by using InGaAlAsSb or InAlAsSb. In addition, desirable thickness of quantum-well layers for such an electro-absorption optical modulator as the present embodiment is from 6 to 15 nm since thicker quantum well layers produce a more significant quantum-confined Stark effect.

Fifth Embodiment

Figure 10:
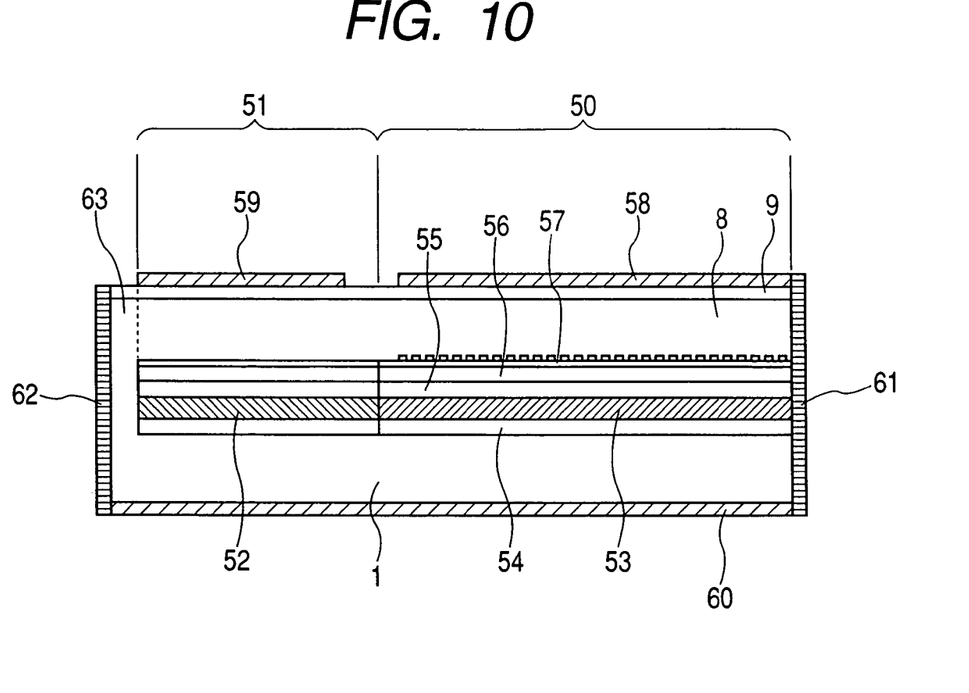
FIG. 10 is a structural view of an optical semiconductor device, showing a further embodiment of the present invention.

A fifth embodiment of the present invention is applied to an optical integrated device, an integrated unit of a semiconductor laser and an electro-absorption optical modulator for modulating laser light. A longitudinal sectional view of the optical integrated device when seen from a direction parallel to a ridge waveguide mesa stripe of the device is shown in FIG. 10. Reference number 1 in FIG. 10 denotes an n-type InP wafer, 50 a laser region of the optical integrated device, 51 an electro-absorption optical modulator region, and 54 an SCH layer of 0.08-μm-thick n-type InGaAlAs with a carrier concentration of $1 \times 10^{18}$ cm$^{-1}$ and a composition wavelength of 0.95 μm. Reference number 55 denotes an SCH layer of 0.08-μm-thick p-type InGaAlAs with a carrier concentration of $0.5 \times 10^{17}$ cm$^{-3}$, 56 an electron-stopping layer of 0.04-μm-thick p-type InAlAs with a carrier concentration of $4 \times 10^{17}$ cm$^{-3}$, and 57 a grating layer of 0.05-μm-thick p-type InGaAsP with a carrier concentration of $1 \times 10^{18}$ cm$^{-3}$, the grating layer 57 also functioning as an etching stop layer. Reference number 8 denotes a 1.5-μm-thick p-type InP cladding layer with a carrier concentration of $8\times10^{17}$ cm$^{-3}$, this cladding layer forming a 1.7-μm-wide ridge waveguide mesa stripe. Reference number 9 denotes a contact layer for obtaining ohmic contact with a p-side electrode 58 of the laser region, or with a p-electrode 59 of an optical modulator region, and InGaAs that is lattice-matched to the InP wafer is used to form the contact layer. Reference number 60 denotes an n-side electrode, and 61 denotes a rear-edge reflection film of the semiconductor laser section, the reflection film having a reflectivity of 90%. The grating structure made of the InGaAsP denoted as 57, is formed as a λ/4-structure to obtain high-performance single-mode oscillation. Reference number 53 denotes an MQW layer of the laser region, this MQW layer including a quantum well layer formed of $In_{0.734}Ga_{0.210}Al_{0.056}As$, and a barrier layer formed of $In_{0.368}Ga_{0.399}Al_{0.233}As_{0.92}Sb_{0.08}$ (composition wavelength: 984 μm). The quantum well layer is 5 nm thick and has a compressive strain of 1.4% with respect to InP wafer 1, and the barrier layer is 8 nm thick and has a tensile strain of −0.5% with respect to the InP wafer. The number of quantum well layers is 8, and the total number of barrier layers arranged at top and bottom of each quantum well layer is 9. Band discontinuity ΔEc of a conduction band in this structure is as great as 409 meV. Effective depth $\Delta E_{v\text{-}HL}$ of each quantum well in a valence band is 123 meV. Reference number 52 denotes an MQW layer of the electro-absorption optical modulator, this MQW layer including a quantum well layer formed of $In_{0.661}Ga_{0.268}Al_{0.071}As$, and a barrier layer formed of $In_{0.385}Ga_{0.511}Al_{0.104}As_{0.92}Sb_{0.08}$. The quantum well layer is 9 nm thick and has a compressive strain of 0.9% with respect to the InP wafer, and the barrier layer is 6 nm thick and has a tensile strain of −0.4% with respect to the InP wafer. The number of quantum well layers is 10, and the total number of barrier layers arranged at top and bottom of each quantum well layer is 11. The modulator section employs a large ΔEc value of 214 meV and a small ΔEv value of 21 meV, thus taking an ideal band structure. Reference number 62 denotes an anti-reflection film with a reflectivity of 0.6% or less, and a window structure 63 of the InP layer is provided to further reduce an effective reflectivity.

During operation of this optical modulator-integrated device, the laser section is maintained in an active condition at all times and the electro-absorption modulator section operates at high speed to modulate laser light. When MQW structure 52 inside the modulator applies a reverse voltage to the electrode 59 thereof, the laser light is absorbed by the modulator because of a quantum-confined Stark effect, whereby the laser light is prevented from being output to outside. When the voltage applied to upper electrode 59 of the modulator is low, however, the laser light is output to the outside without being absorbed into the modulator.

This electro-absorption optical modulator-integrated device has an extremely short fall time of 18 ps, and 24-GHz high-frequency response characteristics and low-chirping characteristics of the device allow transmission to a normal dispersion fiber at a maximum distance of 40 km and at a transmission rate of 24 Gbps. In terms of reliability, this device also has a life of $2\times10^6$ hours at 85° C., 10 mW. While an electro-absorption optical modulator-integrated device has been described in the present embodiment, it goes without saying that the present invention can also be applied to a Mach-Zender-type optical modulator-integrated device and the like similarly. In addition, the invention can likewise be applied to a mode expander optical integrated device that converts a mode field of light. Furthermore, the invention is, of course, also applicable to a laser array having a horizontally integrated set of lasers, and to the like. Besides, although an integrated device of a ridge waveguide structure has been described by way of example, the invention is, of course, also applicable to an integrated device of a buried heterostructure.

Sixth Embodiment

Figure 11:
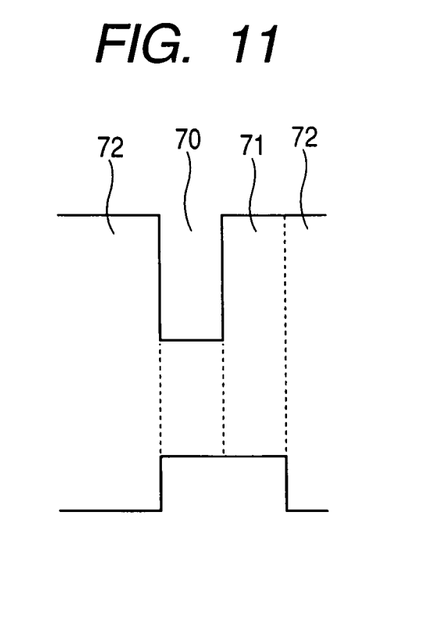
FIG. 11 is an energy band diagram showing a further embodiment of the present invention.

A sixth embodiment is an example in which the present invention is applied to a 1.55-μm-band electro-absorption optical modulator for communication, fabricated on an InP wafer. This modulator can be of a known structure, except for MQW absorption layers, and a structure similar to the structure of the fourth embodiment, shown in the perspective view of FIG. 8, is applied in the present embodiment. One quantum well layer inside MQW layer 30 is shown in FIG. 11. Reference number 70 in FIG. 11 denotes a 0.85%-strained, 6-nm-thick quantum well layer of $In_{0.654}Ga_{0.290}Al_{0.056}As$, and 71 denotes a layer formed of $In_{0.517}Ga_{0.438}Al_{0.046}As_{0.881}Sb_{0.129}$ with a strain of +0.85% and a thickness of 5 nm. The layer 71 acts, in a conduction band, as a barrier layer for electrons, and in a valence band, as a quantum well layer. Reference number 72 denotes a −0.5%-strained, 5-nm-thick barrier layer of $In_{0.403}Ga_{0.511}Al_{0.086}As_{0.995}Sb_{0.005}$. The InGaAlAsSb layer 71 has its composition ratio adjusted to obtain a conduction band edge flush with that of the barrier layer 72, and a valence band edge flush with that of the quantum well layer 70. Band discontinuity ΔEc between the barrier layer 72 and the well layer 71 is 169 meV, and ΔEv is 30 meV. In the MQW layer 30, eight such quantum well layers as shown in FIG. 11 are stacked, and in terms of positional relationship of the quantum well layer in FIG. 11, a p-type InGaAlAs GRIN-SCH layer 5 is disposed at left, and an n-type InGaAlAs GRIN-SCH layer 3, at right.

Figure 12:
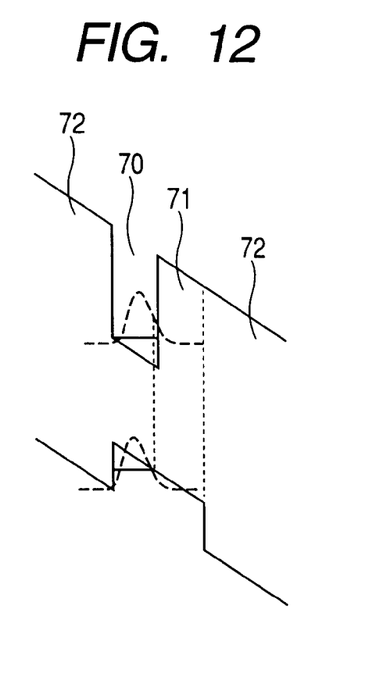
FIG. 12 is an energy band diagram showing a further embodiment of the present invention.
Figure 13:
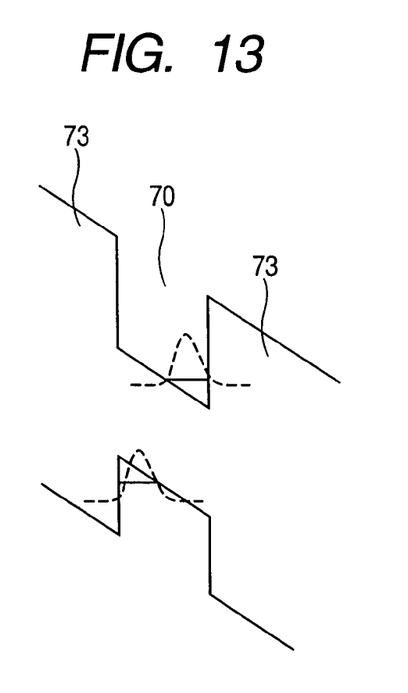
FIG. 13 is an energy band diagram showing another conventional example.

Applying a negative voltage to a p-side electrode of the electro-absorption optical modulator of such a structure changes the band as in FIG. 12, thus reducing a bandgap at an absorption edge of MQW. At this time, wave functions for base levels of the conduction band and valence band within the quantum well layer appear as denoted by dashed curves in the figure. Therefore, an overlapping integral of a distribution probability of electrons and holes remains large, even under high electric field strength, so a preferable extinction ratio of light can be obtained. FIG. 13 shows a conventional quantum well structure, in which case, under high electric field strength, the extinction ratio deteriorates since the overlapping integral of the distribution probability of electrons and holes diminishes. As can be seen from these, it is possible, by adopting the structure of the present invention, to achieve an electro-absorption optical modulator that offers a larger extinction ratio than in the conventional structure, even under high electric field strength. In addition, greater ΔEc, and smaller ΔEv, than in the conventional examples, can be achieved. This makes it possible to achieve a preferable electro-absorption optical modulator which, compared with the conventional devices, has a very small absorbance of light at a '1' level and is free from a pattern effect of input signals due to pile-up, and from deterioration due to chirping.

The electro-absorption optical modulator of the present invention has an extremely short fall time of 12 ps, and 45-GHz high-frequency response characteristics, 20-dB extinction ratio, and low-chirping characteristics of this modulator allow transmission to a normal dispersion fiber at a maximum distance of 20 km and at a transmission rate of 40 Gbps.

It is estimated that long-term reliability can be obtained by adopting the same strain-compensated structure as that of a laser, for this modulator similarly to the fourth embodiment. It is desirable, therefore, that a tensile strain of at least −0.1% (in terms of absolute strain value, 0.1% or more) should be applied to the barrier layers.

In the present embodiment, the composition of InGaAlAsSb was adjusted in order for ΔEv to become 30 meV. Adjusting the composition between Sb, In, and Al, however, makes ΔEc and ΔEv independently adjustable and allows ΔEc and ΔEv to be optimized together with parameters such as the number of quantum well layers.

Additionally, while the present embodiment has applied compressive strain to form the quantum well layers and the InGaAlAsSb layer 71, tensile strain may be applied instead. If tensile strain is applied, since the quantum well layers must be constructed of InGaAs to form the 1.55-μm-band electro-absorption optical modulator, the same configuration as that of the present embodiment can be taken by combining the quantum well layers with InGaAlAsSb barrier layers of a compressive strain. At this time, polarization dependence of light is diminished by certain tensile strain at the quantum well layers, so a preferable electro-absorption optical modulator can be created. In this case, it is desirable in terms of reliability that a compressive strain of at least 0.1% be applied to the barrier layers.

The meanings of the reference numbers used in the drawings accompanying this application are as follows:

1 . . . n-type InP wafer,
2 . . . n-type InAlAs layer,
3 . . . n-type InGaAlAs GRIN-SCH layer,
4 . . . InGaAlAs/InGaAlAsSb-MQW layer,
5 . . . p-type InGaAlAs GRIN-SCH layer,
6 . . . p-type InAlAs electron-stopping layer,
7 . . . p-type InGaAsP grating layer,
8 . . . p-type InP cladding layer,
9 . . . p-type InGaAs layer,
10 . . . SiO₂ passivation layer,
11 . . . electrode for p-type semiconductor
12 . . . electrode for n-type semiconductor,
13 . . . InGaAlAs quantum well layer,
14 . . . InGaAlAsSb barrier layer,
15 . . . InGaAlAs quantum well layer (non-strained),
16 . . . InGaAlAs barrier layer (non-strained),
17 . . . InGaAsP quantum well layer (non-strained),
18 . . . InGaAsP barrier layer (non-strained),
19 . . . p-type InP wafer,
20 . . . p-type InGaAlAs-SCH layer,
21 . . . InGaAlAs/InGaAlAsSb-MQW layer,
22 . . . n-type InGaAlAs-SCH layer,
23 . . . p-type InAlAs electron-stopping layer,
24 . . . InGaAsP grating layer,
25 . . . n-type InP cladding layer,
26 . . . n-type InGaAsP contact layer,
27 . . . . Semiconductor current blocking layer,
30 . . . InGaAlAs/InGaAlAsSb-MQW layer,
31 . . . . Polyimide,
50 . . . . Laser region of integrated device,
51 . . . . Modulator region of integrated device,
52 . . . . Transition region,
53 . . . MQW layer of laser region,
54 . . . n-type SCH layer,
55 . . . p-type SCH layer,
56 . . . p-type InAlAs electron-stopping layer,
57 . . . p-type InGaAsP grating layer,
58 . . . electrode of laser region for p-type semiconductor,
59 . . . electrode of modulator region for p-type semiconductor,
60 . . . electrode for n-type semiconductor
61 . . . . Rear-edge reflection film,
62 . . . . Front-edge reflection film,
63 . . . InP window layer,
70 . . . InGaAlAs quantum well layer,
71 . . . InGaAlAsSb layer,
72 . . . InGaAlAsSb barrier layer,
73 . . . InGaAlAs barrier layer.

What is claimed is:

1. An optical semiconductor device comprising:
a first semiconductor layer with a first type of conductivity, formed on an InP semiconductor wafer;
a multi-quantum-well structure formed on said first semiconductor layer; and
a second semiconductor layer formed on said multi-quantum-well structure, wherein said second semiconductor layer has a second type of conductivity different from the first type of conductivity;
wherein:
said multi-quantum-well structure includes, in an alternately stacked form, quantum well layers each formed of InGaAlAs which has a lattice constant different from that of said InP semiconductor wafer, and barrier layers each formed of InGaAlAsSb which has lattice constants different from those of said InP semiconductor wafer and the InGaAlAs layer; and
each of the quantum well layers has first strain with respect to said InP semiconductor wafer, each of the barrier layers has second strain with respect to said InP semiconductor wafer, and a sign of the first strain and a sign of the second strain differ from each other.

2. The optical semiconductor device according to claim 1, wherein:
said first semiconductor layer has a stacked structure in which a first cladding layer and a first optical separated confinement heterostructure are arranged in a stacked form;
said second semiconductor layer has a stacked structure in which a second cladding layer and a second optical separated confinement heterostructure are arranged in a stacked form; and
said multi-quantum-well structure is provided adjacently to each of the first optical separated confinement heterostructure and the second optical separated confinement heterostructure.

3. The optical semiconductor device according to claim 1, wherein the multi-quantum-well structure layer has an impurity-doped barrier.

4. The optical semiconductor device according to claim 1, wherein said optical semiconductor device is a semiconductor laser.

5. The optical semiconductor device according to claim 1, wherein said optical semiconductor device is an electro-absorption optical modulator.

6. The optical semiconductor device according to claim 1, wherein the optical integrated device is formed by integrating an electro-absorption optical modulator and a semiconductor laser.

7. The optical semiconductor device according to claim 6, wherein: the electro-absorption optical modulator and the semiconductor laser are formed on an InP semiconductor wafer
one end of a first multi-quantum-well structure provided in the electro-absorption optical modulator and one end of a second multi-quantum-well structure provided in the semiconductor laser are optically coupled to each other; and a front-edge anti-reflection coating and a rear-edge reflection coating are provided at the other end of the first multi-quantum-well structure and the other end of the second multi-quantum-well structure, respectively.

8. An optical semiconductor device comprising:

a multi-quantum-well structure formed on an InP semiconductor wafer;

a first semiconductor layer and second semiconductor layer for applying a voltage to or injecting an electric current into said multi-quantum-well structure;

a first electrode electrically connected to said first semiconductor layer; and a second electrode electrically connected to said second semiconductor layer;

wherein:

said multi-quantum-well structure includes, in an alternately stacked form, quantum well layers each formed of InGaAlAs which has a lattice constant different from that of said InP semiconductor wafer, and barrier layers each formed of InGaAlAsSb which has lattice constants different from those of said InP semiconductor wafer and the InGaAlAs layer; and each of the quantum well layers has first strain with respect to said InP semiconductor wafer, each of the barrier layers has second strain with respect to said InP semiconductor wafer, and a sign of the first strain and a sign of the second strain differ from each other.

9. The optical semiconductor device according to claim 8, wherein:

said first semiconductor layer is formed up of at least one layer, inclusive of a first type of conductivity; and said second semiconductor layer is formed up of at least one layer, inclusive of a second type of conductivity whose characteristics are opposite to those of the first type of conductivity.

10. The optical semiconductor device according to claim 8, wherein: said first electrode is connected to a first semiconductor layer with a first type of conductivity by ohmic contact, and said second electrode is connected to a second semiconductor layer with a second type of conductivity different from that with the first type of conductivity, by ohmic contact.

11. The optical semiconductor device according to claim 8, wherein, when a voltage or an electric current is applied or injected, respectively, between said first electrode and said second electrode, light generated in said multi-quantum-well will be guided in a routing direction of the electric current flowing between said first electrode and said second electrode.

12. The optical semiconductor device according to claim 8, wherein, when a voltage or an electric current is applied or injected, respectively, between said first electrode and said second electrode, light generated in said multi-quantum-well will be guided in a direction different from a routing direction of the electric current flowing between said first electrode and said second electrode.

13. An optical semiconductor device comprising:

a first semiconductor layer with a first type of conductivity, formed on an InP semiconductor wafer;

a multi-quantum-well structure formed on said first semiconductor layer; and a second semiconductor layer formed on said multi-quantum-well structure, wherein said second semiconductor layer has a second type of conductivity different from the first type of conductivity;

wherein:

said multi-quantum-well structure includes quantum well layers each formed of InGaAlAs which has a lattice constant different from that of said InP semiconductor wafer, a first barrier layer formed of InGaAlAsSb which has lattice constants different from those of said InP semiconductor wafer and the InGaAlAs layer, a first intermediate layer of InGaAlAsSb which has a composition ratio different from that of the InGaAlAsSb constituting the first barrier layer, and a second barrier layer having the same composition ratio as that of the first barrier layer;

at least one layer exists as a quantum well structure in which the first barrier layer, the quantum well layer, the first intermediate layer, and the second barrier layer are stacked in that order;

each of the quantum well layers has first strain with respect to said InP semiconductor wafer, and the first and second barrier layers each have second strain with respect to said InP semiconductor wafer; and a sign of the first strain and a sign of the second strain differ from each other.

14. The optical semiconductor device according to claim 13, wherein, in said multi-quantum-well structure, a quantum well layer on a conduction band side and a quantum well layer on a valence band side differ from each other in thickness.

15. The optical semiconductor device according to claim 13, wherein, in said multi-quantum-well structure, a quantum well layer on a valence band side is thick, compared with the quantum well layer on a conduction band side.

* * * * *